United States Patent [19]

Clark

[11] Patent Number: 4,820,991

[45] Date of Patent: Apr. 11, 1989

[54] APPARATUS FOR DETERMINATION OF THE LOCATION OF A FAULT IN COMMUNICATIONS WIRES

[75] Inventor: Brian D. Clark, Mesa, Ariz.

[73] Assignee: Progressive Electronics, Inc., Mesa, Ariz.

[21] Appl. No.: 251,958

[22] Filed: Sep. 30, 1988

Related U.S. Application Data

[63] Continuation of Ser. No. 812,758, Dec. 23, 1985, abandoned.

[51] Int. Cl.[4] ............ G01R 31/08; G01R 11/52; G01R 27/26
[52] U.S. Cl. ............... 324/519; 324/60 CD; 379/26
[58] Field of Search ......... 324/539, 540, 541, 519, 324/527, 60 C, 60 CD; 379/1, 26

[56] References Cited

U.S. PATENT DOCUMENTS

| | | | |
|---|---|---|---|
| 3,944,914 | 3/1976 | Simmonds | 379/26 |
| 4,032,841 | 6/1977 | Knippelmier | 324/60 CD |
| 4,103,225 | 7/1978 | Stephens | 324/60 CD |
| 4,404,481 | 9/1983 | Ide et al. | 324/60 CD |

FOREIGN PATENT DOCUMENTS 936660 10/1963 United Kingdom ......... 324/60 CD

Primary Examiner—Reinhard J. Eisenzopf
Assistant Examiner—Walter E. Snow
Attorney, Agent, or Firm—M. David Shapiro

[57] ABSTRACT

An improved instrument for determining the distance to an open fault in a communications line, the instrument taking advantage of the predictable relationship between the current discharge rate in a reference capacitor and resistor and the current discharge rate in a faulty line whose capacitance is a function of the distance to the fault. Provisions are made to keep the meter readings within the usable scale of the meter of the invention by allowing the operator to select from among a range of driving signal frequencies to suit the distance to the fault. Calibration may be made by reference to an internal capacitor or by means of measuring a known length of open circuited line of the type to be tested. Provision is also made to provide for "tuning out" "dirty" short circuits.

8 Claims, 2 Drawing Sheets

APPARATUS FOR DETERMINATION OF THE LOCATION OF A FAULT IN COMMUNICATIONS WIRES

This application is a continuation of co-pending application Ser. No. 812,758 filed on Dec. 23, 1985, entitled "Improved Open Fault Meter" now abandoned.

FIELD OF THE INVENTION

The invention relates to portable open fault meters used in field work for determining the location of open circuit faults in telephone wire pairs, cables and the like.

BACKGROUND OF THE INVENTION

As best understood, prior art portable open fault instruments have been of at least two types; those which utilize a constant current or a constant voltage fed through a resistor to the capacitance of an unknown length of cable (or wire pair) where the time to charge that capacitance to a predetermined threshold level is measured and used as an indication of the value of the capacitance, and systems which operate as a capacitance bridge with the unknown capacitance inserted in the test circuit as one leg of that bridge.

Analog meters which utilize the capacitance of the cable or wire pair under test to transfer a precision generated frequency therethrough, as in a coupling capacitor between amplifiers, may have been used in a laboratory environment to make comparable measurements.

Neither system handles "dirty" open circuits well. A "dirty" open circuit, as is well known in the industry, is one which is somewhat less than an infinite impedance open circuit. Many of the problems encountered in the field are of that nature; there is a finite impedance in the so-called "open circuit" which acts to the detriment of transfer of useful communications signals down the line.

The prior art instruments which have been available to the industry for portable field test work have tended to be expensive, of large volume and relatively heavy, some being on the order of fifteen pounds in weight.

SUMMARY OF THE INVENTION

These and other problems with prior art open fault meters are overcome by means of the improved circuits of the instant invention which allow for a low cost, reduced size and weight, battery operated open fault meter which may be easily used and calibrated in the field by one of relatively low skill in the art of finding open faults in communications circuits.

The circuit of the instant invention utilizes a single semi-precision capacitor for calibration of the meter. The test signal is a symmetrical square wave which is selectable for fundamental frequency. That selection determines the range of the meter. Determination of the distance from the meter to the open fault is made by comparing the calibrating capacitance value to the capacitance value of the open pair or shielded cable by means of the calibrated meter movement reading.

The meter movement is used to integrate a portion of the discharge current from the calibration capacitor over a one-half cycle period of the input test signal.

It is, therefore, an object of the invention to provide a small, portable, light weight field test instrument for determining the actual location of an open circuit fault in a communications cable or wire pair.

It is another object of the invention to provide a capacitance measuring system for portable field use which may be used to determine the location of an open fault in a communications cable or wire pair, such system providing for accurate, repeatable measurements without the use of any highly precision components.

It is still another object of the invention to measure the capacitance of a communications cable or wire pair having an open fault at an unknown point in the cable or wire by charging the capacitance of the cable or wire through a first charging network having a relatively fast time constant and then discharging that cable or wire capacitance through a second discharge network which has a longer time constant and by comparing the integrated discharge current to that of a known capacity.

It is yet another object of the invention to compare the integrated discharge current of a known length of a particular wire or cable type to that of an unknown length of the same type of wire pair or cable and to establish the length of the unknown wire pair or cable by means of the comparison.

It is still another object of the invention to provide a means of "tuning out" the detrimental affect of a "dirty" open circuit in a wire pair or cable line.

These and other objects of the invention will be more readily understood upon review of the Detailed Description of the Preferred Embodiment of the Invention, below, together with the drawings in which.

Figure 1:
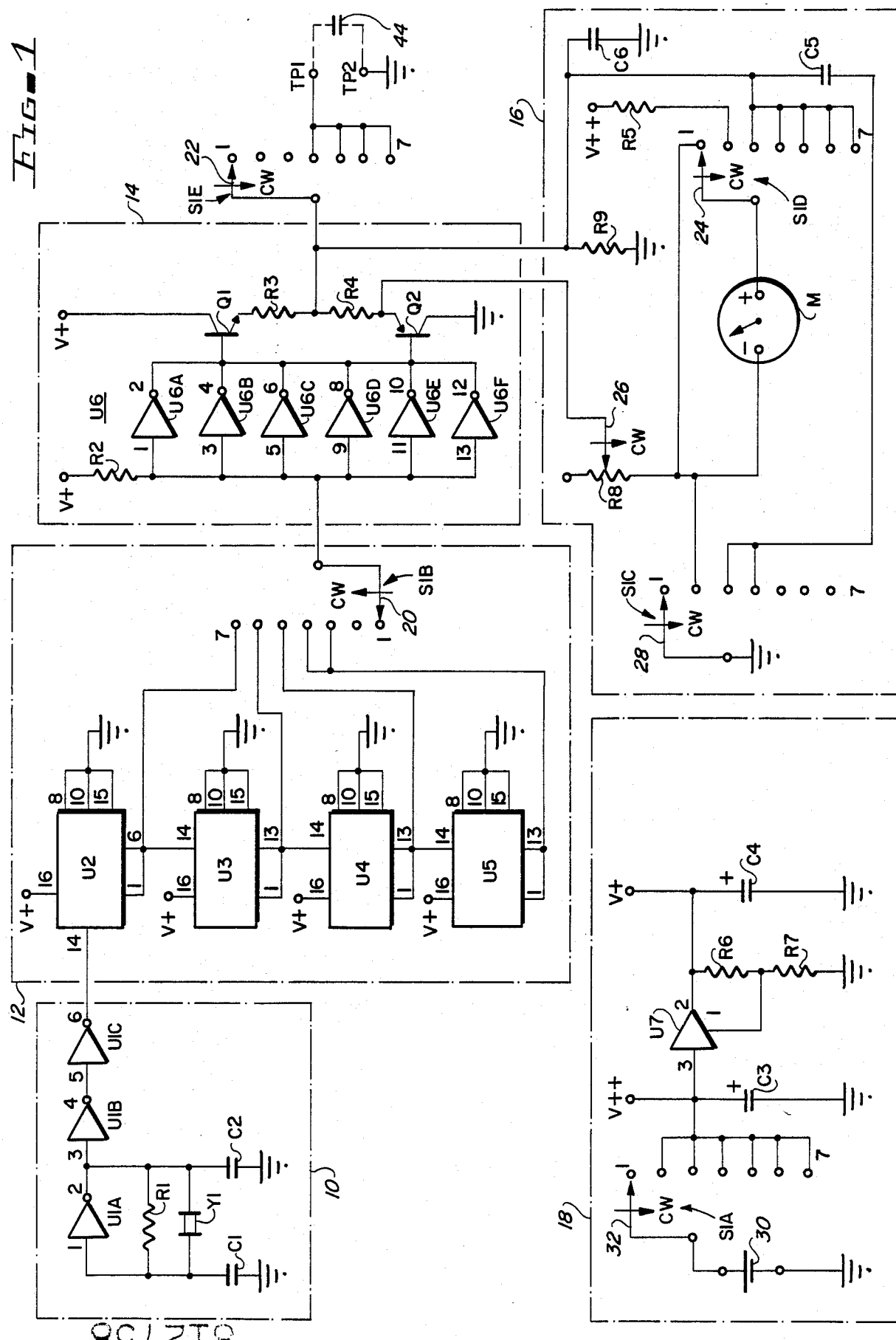
FIG. 1 is a schematic drawing of the preferred embodiment of the circuit of the invention.
Figure 4:
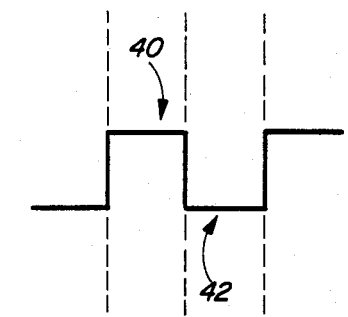
Figure 3:
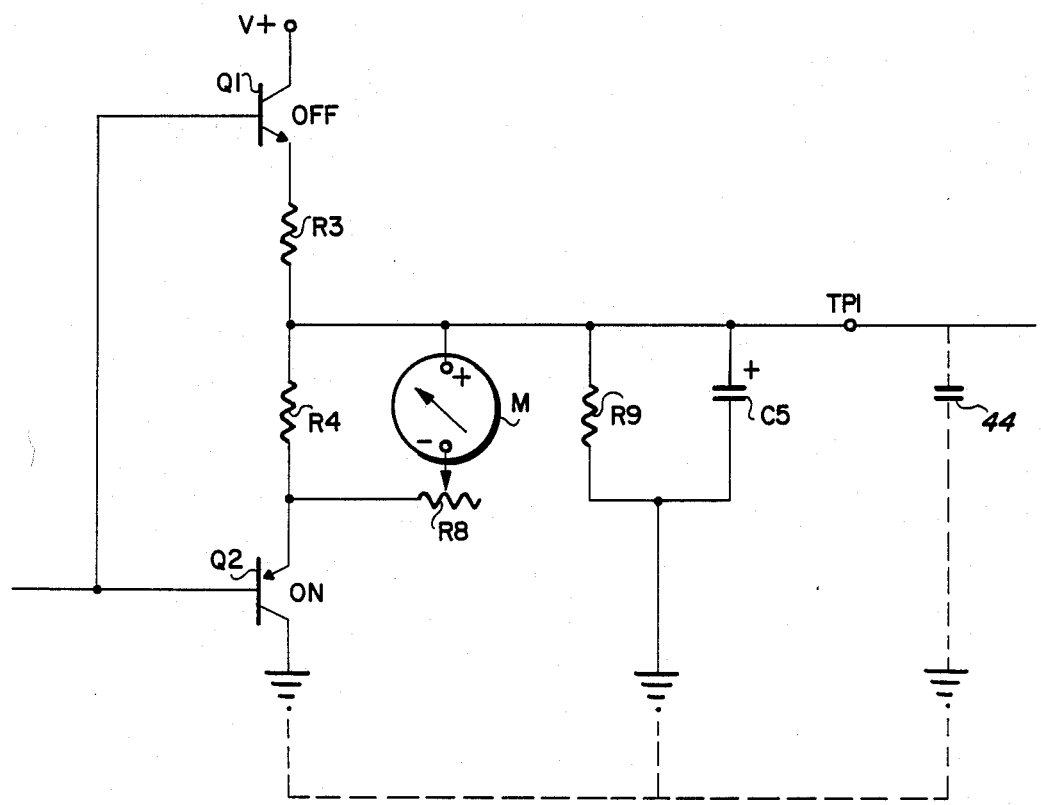

FIG. 3 is a schematic drawing of the equivalent of calibration network 16 of FIG. 1 during the input half cycle devoted to discharging capacitor C5; and FIG. 4 shows graphically the form of the square wave output of signal generator 10 and the dividers 12 of FIG. 1.

DETAILED DESCRIPTION OF THE PREFERRED EMBODIMENT OF THE INVENTION

Referring first to FIG. 1, it may be seen that the preferred embodiment of the circuit of the invention comprises signal generator 10, divider network 12, driver circuit 14, and calibration network 16. Power source 18 provides power for the rest of the circuit of the invention.

Signal generator 10 further comprises ceramic resonator Y1 which may be a CSB480E device as manufactured and sold by Murata Erie, 1148 Franklin Road, S.E., Marietta, Ga. 30067. R1, a one megohm resistor is connected across Y1. C1 and C2, 100 pf capacitors are connected between ground and each end of Y1, respectively. U1A, one section of a CD4069UB hex inverter manufactured by RCA, is connected at its input terminal (pin 1) to the ungrounded end of capacitor C1 and to one terminal of ceramic resonator, Y1, and at its output terminal (pin 2) to the ungrounded end of capacitor C2 and to the other end of ceramic resonator Y1.

Sections B and C of inverters U1 are connected in series with the output of U1A and perform a buffering and amplifying function for the output of signal generator 10. The signal generator configuration shown in FIG. 1, reference numeral 10, provides an output signal with a fundamental frequency of approximately 480 kHz to feed divider network 12. The output signal from signal generator 10 is a symmetrical square wave having a positive phase 40 and a negative phase 42 as shown in FIG. 4.

Output terminal (pin 6) of integrated circuit U1C is connected to the input terminal (pin 14) of frequency divider U2. Dividers U2, U3, U4 and U5 may all be Part Number CD4018B integrated circuit frequency dividers, as manufactured by RCA. U2 is a frequency divider connected so as to divide by 6 by means of an external connection between output terminal (pin 6) and input data terminal (pin 1). Dividers U3, U4 and U5 are each connected as divide by 10 circuits by means of the external connection between each output terminal (pins 13) and each data input terminal (pins 1), respectively. As may be seen in FIG. 1, the output of U2 is connected to the input of U3, the output of U3 is connected to the input of U4 and the output of U4 is connected to the input of U5.

The output from pin 6 of divider U2 is connected to pin 7 of section B of switch S1. The output of divider U3 at pin 13 is connected to pin 6 of switch section S1B. The output at pin 13 of U4 is connected to pin 5 of switch section S1B. And, similarly, the output of divider U5, pin 13, is connected to pin 4 of switch section S1B, one section of multi-section switch, S1. Wiper 20 of switch section S1B is the output of divider network 12 and is connected to the input of driver circuit 14.

Driver 14 comprises six power amplifiers U6A–U6F connected in parallel. U6 is an RCA integrated circuit Part Number CD4069UB comprising six inverter amplifiers, all of which are utilized in the preferred circuit embodiment. The input terminals of inverters U6A–U6F (pins 1, 3, 5, 9, 11 and 13, respectively) and the output terminals (pins 2, 4, 6, 8, 10 and 12, respectively) are connected in common. The common output terminals of all sections of U6 are connected to the bases of NPN transistor Q1 and PNP transistor Q2.

The collector of transistor Q1 is connected to regulated voltage source V+. The emitter of transistor Q1 is connected to one end of 10 ohm resistor R3. The other end of resistor R3 is connected to one end of 100 ohm resistor R4 and to wiper 22 of switch section S1E. The other end of resistor R4 is connected to the emitter of transistor Q2. The collector of transistor Q2 is connected to ground. U6 (all sections) and transistors Q1 and Q2, together with resistors R3 and R4 comprise driver network 14. Vss (pin 7) of U6 (not shown) is connected to the regulated power supply voltage, V+, within power source 18. (The connection is not shown in order to preserve clarity in the drawing.)

Calibration circuit 16 includes capacitor C5, a 4.0 microfarad metallized polycarbonate capacitor with a 1% tolerance rating. The negative end of capacitor C5 is connected to pins 3 and 4 of switch section S1C. The positive end of capacitor C5 is connected to pins 3, 4, 5, 6 and 7 of switch section S1D, to one end of capacitor C6, a 39 picofarad capacitor, to one end of 1000 ohm resistor R9, to the junction of resistors R3 and R4 and to wiper 22 of switch section S1E. The other end of capacitor C6 is connected to ground. The other end of resistor R9 is connected to ground.

The positive terminal of meter, M, is connected to wiper 24 of switch section S1D. The negative terminal of meter M is connected to pin 2 of switch section S1C and to one end of R8, a ten turn precision potentiometer having a maximum resistance equal to 1000 ohms. Wiper 26 of potentiometer R8 is connected to the junction of R4 and the emitter of Q2, part of driver 14.

Wiper 28 of switch section S1C is connected to ground. Pin 2 of switch section S1D is connected to V++, the unregulated power source, through 62K ohm resistor R5.

Power source 18 comprises battery 30, having a grounded negative terminal and a positive terminal which is connected to wiper 32 of switch section S1A. Battery 30 may comprise eight conventional, size AA dry battery cells. Pins 2–7 of switch section S1A are connected in common to the positive terminal of capacitor C3, to unregulated power output terminal V++ and to the input terminal (pin 3) of voltage regulator U7. Voltage regulator U7 may be Part Number LM317L as manufactured by National Semiconductor Corporation. The negative terminal of capacitor C3 is connected to ground.

The output terminal (pin 2) of regulator U7 is connected to one end of 1000 ohm resistor R6, to the positive terminal of 10.0 microfarad capacitor C4, and to the regulated output terminal of power source 18, V+. The other end of resistor R6 is connected to one end of 3900 ohm resistor R7 and to the voltage control terminal (pin 1) of regulator U7. The other end of resistor R7 is connected to ground. This completes the description of the circuit of the invention.

OPERATIONAL THEORY

Signal generator 10 produces a square wave signal at pin 14 of U2. This signal is divided down in fundamental frequency from 480 kHz to 80 kHz, 8 kHz, 800 kHz and 80 Hertz by dividers U2, U3, U4 and U5, respectively.

Wiper 20 of switch section S1B is used to select the desired operating frequency. Of course, it will be recognized that pin 1 position of switch S1 is the OFF position, there being no power connected to the circuit of the invention in that position. Meter M has the usual screwdriver adjustment provision for meter zero control with no power applied. This adjustment is accomplished with switch S1 in the OFF position.

The pin 2 switch S1 position is the battery test position. Battery 30 is connected through switch section S1A to voltage regulator U7, which supplies all circuits with regulated power. However, note that in this battery test mode, switch section S1B is connected to an open pin 2 and there is no drive provided to or from drive circuit 14. The battery is thus tested with all circuits drawing quiescent current. Meter M is connected through resistor R5 to the unregulated V++ terminal and to ground through switch section S1C, pin 2. R5 is selected to provide a somewhat higher than midrange meter reading for battery test. The meter may be appropriately marked for such a test.

Figure 2:
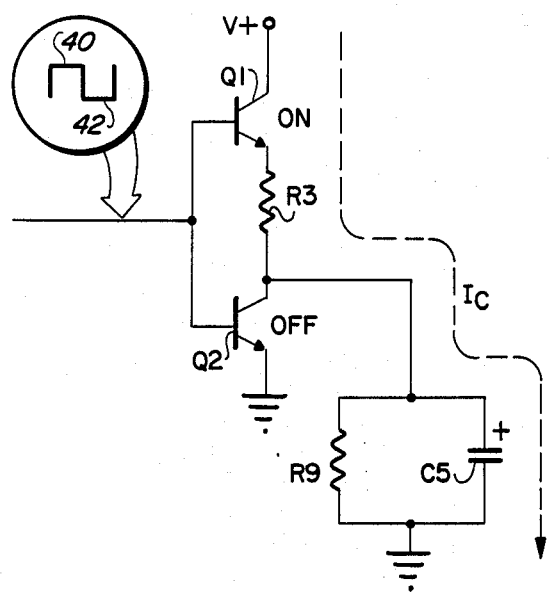
FIG. 2 is a schematic drawing of the equivalent of calibration network 16 of FIG. 1 during the input half cycle devoted to discharging capacitor C5.

When switch S1 is moved to the pin 3 position, the circuit of the invention may be calibrated. Divider network 12 provides a 80 Hertz output to drive circuits 14 in this switch mode. Capacitor C5 is charged during the positive half cycle 40 (see FIG. 4) square wave input signal excursion. (FIG. 2 shows the equivalent circuit of the charge current path during this half cycle.) NPN transistor Q1 is turned on and PNP transistor Q2 is turned off by the positive excursion of the input signal on the bases of the transistors, Q1 and Q2. Capacitor C5 is charged with current conducted through transistor Q1 and 10 ohm resistor R3, through capacitor C5 to ground. The charge path has a relatively fast time constant because of the low impedance of resistor R3 and heavily conducting transistor Q1. Meter M is essentially out of the circuit because transistor Q2 is turned off (only a very small leakage current flows through transistor Q2 and resistor R4).

During the negative going half cycle 42 of the input signal, capacitor C5 partially discharges. (An equivalent circuit of the discharge current path is shown in FIG. 3.) A portion of the discharge path is through meter M which is somewhat damped in its action by its own movement inertia. Meter M, therefore reads an average current value over the whole input cycle of the signal from driver 14. R8 is used by the operator to set meter M to read a value commensurate with the type of cable or other communications line to be tested with the instrument of the invention. Table I, below, indicates settings for the 640 ohm, 200 microampere meter M which has been employed in the preferred embodiment of the invention.

and open circuited at the far end. This is accomplished in the LINE TEST mode (pin 3 position of the wipers of selection switch S1), as stated, above. Once calibrated for a given wire or cable type and length, the circuit is very accurate at all distances within any of its ranges. Of course, it will be apparent that other ranges may be accomplished as a matter of design choice by changing the range of frequencies provided by divider circuits 12.

To make a distance test for an open fault, the operator selects one of three ranges: 0–200 feet (pin 7 position of the wipers of S1), 0–2000 feet (pin 6 position of the wipers of S1) or 0–20,000 feet (pin 5 of the wipers of selector switch S1). For the 0–200 foot range setting, readings are taken directly from meter M; 1.0 microampere being equal to 1.0 foot in distance to the open fault.

TABLE I

| CABLE CAPACITANCE OR TYPE | CONDUCTOR TO SHEATH MEASUREMENTS | MUTUAL CAPACITANCE MEASUREMENTS (multiply meter readings by 2) |
| --- | --- | --- |
| 0.1 Microfarad/mile | 141 | 106 |
| 0.092 | 153 | 115 |
| 0.083 | 170 | 127 |
| Aerial drop wire | N/A | 92 |
| IW (inside wire) | N/A | 129 |

It should be noted that the figures of this table are derived from actual measurements of known lengths of each of the cable or wire pair types. It is useful to understand that a known length of cable of a given type may be measured in the LINE TEST mode of operation of the instrument of the invention and, then, the CALIBRATION mode may be entered to set the meter M to the same reading. (See below.) In that way, calibration of meter M may be reset precisely, even in the field, and even if capacitor C5 is not accurately known in terms of its capacitance.

It is believed that it would be possible to measure the charging current to capacitor C5 rather than the discharge current as is done in the preferred embodiment of the invention. That this was not done is a matter of design choice.

When wipers 32, 20, 28, 24 and 22 (hereinafter, "wipers") of selector switch S1 sections A–E, respectively, are set to pin position 4, a LINE TEST may be accomplished. Test leads are connected between test points TP1 and TP2 and to cable or wires 44 to be tested or used for calibration. An output signal having a fundamental frequency of 80 Hertz, from driver circuit 14, U5, pin 13 is applied to the line under test between switch section S1E, pin 4 and ground. Any meter reading variation from the setting made in the CALIBRATION mode represents a fault condition which must be compensated for prior to making a distance test (normally the next step). The fault referred to here is the type which is caused by a "dirty" open circuit in cable or wire pair 44. It is compensated for by resetting calibration potentiometer R8 to obtain the same meter reading obtained during calibration of the instrument of the invention. Effectively, the fault is "tuned out" by this procedure. For cable 44 lengths of over 2000 feet, it is not necessary or even desirable to "tune out" sall variations from the calibrated meter reading values. Once this LINE TEST procedure is completed, the operator may proceed to make a distance test measurement.

Alternatively, calibration may be accomplished by using a known length of cable or wire 44 connected to terminals TP1 and TP2 of the circuit of the invention For the 0–2000 foot range, the meter readings must be multiplied by 10; 1.0 microampere being equal to 10 feet in distance to the open fault. For the 0–20,000 foot range, the meter readings must be multiplied by 100; 1.0 microampere being equal to 100 feet in distance to the open fault. Note that the only difference in the internal operation of the circuit of the invention caused by the three range settings is the fact that the fundamental frequency utilized is changed by a factor of 10 for each incremental change in range. This is accomplished by means of operating section B of selector switch S1 switching driver 14 input to the output of one of U2, U3 or U4 dividers, each part of divider network 12.

It will be well understood by one of ordinary skill in the electronic art that the impedance of a capacitor is reduced as the frequency applied is increased according to the equation:

$$X_c = \tfrac{1}{2}\pi F C$$

Where
  $X_c$ is the capacitive reactance (impedance) in ohms,
  F is the frequency in Hertz, and
  C is the capacitance in Farads.

By increasing the applied frequency to capacitance 44 under test (the capacitance of the cable or communications wire pair 44), the impedance is reduced so that the current flow in meter M is caused to increase. Since for longer ranges to an open fault the capacity of the tested line increases proportionally with the increasing distance (with an attendant decrease in impedance), reducing signal frequency applied compensates for the higher capacitance to maintain the effective impedance at a relatively constant level. Of course, the reverse is true for shorter distances. The combination of higher frequency and lower capacitance or lower frequency and higher capacitance work to keep meter M readings within scale.

Since the frequency used for calibration of meter M and the frequencies used for the range measurements are all related by fixed and accurately known ratios (determined by the dividing ratios of frequency dividers U2–U5 in network 12) calibration may be accurately maintained at any range provided for by the dividers of the circuit. The ratios just referred to, above, may be submultiples or integral multiples of the signal generator 10 frequency; the important factor being the fixed and known relationship between the various signals in terms of relative frequency.

While the invention has been particularly shown and described herein with reference to a preferred embodiment thereof, it will be understood by those skilled in the art that various other modifications and changes may be made to the present invention from the principles of the invention described above without departing from the spirit and scope thereof as encompassed in the accompanying claims. Therefore, it is intended in the appended claims to cover all such equivalent variations as may come within the scope of the invention as described.

What is claimed is:

1. An open fault finding instrument having a pair of test leads for connection to a communications line to be tested, the fault finding instrument being provided with a power source, the instrument comprising in combination:

means for generating a test signal having a positive and a negative phase, one each of said positive phase and said negative phase comprising a cycle;
   a single calibration capacitor;
   means for charging said single calibration capacitor with electrical current, said charging means being driven by one of said phases of said test signal, said charging means having a first time constant;
   means for discharging electrical current from said single calibration capacitor, said discharging means being driven by the other of said test signal phases, said discharging means having a second time constant, said second time constant being different from said first time constant;
   means for measuring an integrated current value of one of said charging current and said discharging current; and
   means for connecting a communications conductor having an open fault at an unknown location therein in parallel with said single calibration capacitor during a continuous time period comprising a plurality of said cycles of said positive phases and said negative phases.

2. The instrument of the invention according to claim 1 wherein said means for generating a test signal further comprises:

signal means for producing a square wave signal having a first fundamental frequency;
   divider means for producing at least another square wave signal having another fundamental frequency, said another square wave frequency being a sub-multiple of said first fundamental frequency and being derived therefrom; and
   means for selecting one of said square wave signals for driving said charging sand discharging means.

3. The instrument of the invention according to claim 1 wherein said divider means comprises at least one frequency dividing circuit.

4. An improved method for determining the capacitance of a communications line comprising the steps of:

charging a capacitance of the communications line for a known period of time through a charging network having a first time constant;
   discharging said capacitance of the communications line for a period of time equal to said known period of time through a discharging network having a time constant longer than said first time constant;
   measuring an integrated value of as discharge current during said discharge of said capacitance of said communications line;
   charging a known single reference capacitance for a period of time equal to said known period of time through said network having said first item constant;
   discharging said single reference capacitance for a period of time equal to said known period of time through said discharging network having said time constant longer than said first time constant;
   measuring an integrated value of a discharge current during said single discharge of said reference capacitance; and
   comparing said integrated discharge current value of said single reference capacitance to said integrated discharge value of said communications line to determine a capacitance of said communications line.

5. The improved method according to claim 4 wherein an unknown distance to an open fault is determined by the further step of:

using a value of said reference capacitance, a known capacitance for a given length of said communications line and said value of said capacitance of said communications line to calculate by analog means the unknown distance to the open fault in the communications line.

6. An open fault finding instrument having a pair of test leads for connection to a communications line to be tested, the fault finding instrument being provided with a power source, the instrument comprising in combination:

means for generating a test signal having a positive and a negative phase;
   a single calibration capacitor;
   means for charging said single calibration capacitor with electrical current, said charging means being driven by one of said phases of said test signal, said charging means having a first item constant;
   means for discharging electrical current from said single calibration capacitor, said discharging means being driven by the other of said test signal phases, said discharging means having a second time constant;
   means for measuring an integrated current value of one of said charging current and said discharging current; and
   means for connecting a communications conductor having an open fault at an unknown location therein in parallel connection with said single calibration capacitor, said parallel connection being maintained throughout the duration of a test for said open fault in said communications conductor.

7. The instrument of the invention according to claim 6 wherein said means for generating a test signal further comprises:

signal means for producing a square wave signal having a first fundamental frequency;
   divider means for producing at least another square wave signal, said at least another square wave signal having another fundamental frequency, said another fundamental frequency being a sub-multiple of said first fundamental frequency and being derived therefrom; and
   means for selecting one of said square wave signals for driving said charging and said discharging means.

8. The instrument of the invention according to claim 7 wherein said divider means comprises at least one dividing circuit.

* * * * *